(12) United States Patent
Hashimoto et al.

(10) Patent No.: US 11,112,696 B2
(45) Date of Patent: *Sep. 7, 2021

(54) PROTECTIVE FILM-FORMING COMPOSITION

(71) Applicant: NISSAN CHEMICAL CORPORATION, Tokyo (JP)

(72) Inventors: Yuto Hashimoto, Toyama (JP); Hikaru Tokunaga, Toyama (JP); Hiroto Ogata, Toyama (JP); Tomoya Ohashi, Toyama (JP); Yasushi Sakaida, Toyama (JP); Takahiro Kishioka, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 137 days.

This patent is subject to a terminal disclaimer.

(21) Appl. No.: 16/333,551

(22) PCT Filed: Sep. 15, 2017

(86) PCT No.: PCT/JP2017/033524
§ 371 (c)(1),
(2) Date: Mar. 14, 2019

(87) PCT Pub. No.: WO2018/052130
PCT Pub. Date: Mar. 22, 2018

(65) Prior Publication Data
US 2020/0183282 A1    Jun. 11, 2020

(30) Foreign Application Priority Data

Sep. 16, 2016  (JP) .............................. JP2016-181956
Jan. 30, 2017  (JP) .............................. JP2017-014819

(51) Int. Cl.
*G03F 7/11*  (2006.01)
*C08F 220/14*  (2006.01)
(Continued)

(52) U.S. Cl.
CPC .............. *G03F 7/11* (2013.01); *C08F 220/14* (2013.01); *C08G 59/3245* (2013.01);
(Continued)

(58) Field of Classification Search
CPC ........ H01L 21/0273; G03F 7/11; G03F 7/094; C08G 59/628; C08G 59/3245; C23F 1/02
(Continued)

(56) References Cited

U.S. PATENT DOCUMENTS 3,407,141 A * 10/1968 Banbush et al. .......... C23F 1/02
                                                           252/79.4
5,420,204 A *  5/1995 Valet ....................... C08L 27/12
                                                           525/125
(Continued)

FOREIGN PATENT DOCUMENTS

EP    0636941 A1 *  2/1995  ............. G03F 7/091
JP    2005-10753 A    1/2005
(Continued)

OTHER PUBLICATIONS

English translation of JP 2016-99374 A obtained from ip.com on Sep. 18, 2020.14 pages . (Year: 2020).*
(Continued)

*Primary Examiner* — Cynthia Hamilton
(74) *Attorney, Agent, or Firm* — Oliff PLC

(57) ABSTRACT

A composition for forming protective films against aqueous hydrogen peroxide solutions, including: a compound of the following formula (1a) or formula (1b) or a compound having a substituent of the following formula (2) and having a molecular weight of 300 or more and less than 800 or a weight-average molecular weight of 300 or more and less than 800; and a solvent, the composition containing the compound of the formula (1a) or formula (1b) of 0.1% by mass to 60% by mass or the compound having the substituent of the formula (2) of 10% by mass to 100% by mass, relative to solids excluding the solvent:

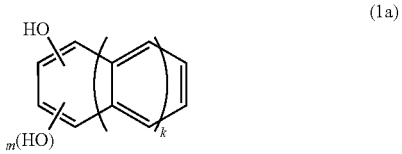

(1a)

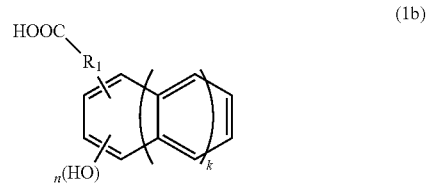

(1b)

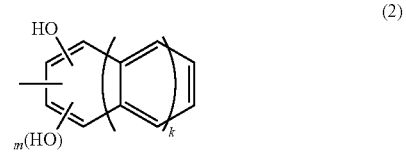

(2)

(wherein $R_1$ is a $C_{1-4}$ alkylene or alkenylene group or a direct bond, k is 0 or 1, m is an integer of 1 to 3, and n is an integer of 2 to 4.)

10 Claims, No Drawings

(51) Int. Cl.
  *C08G 59/32* (2006.01)
  *C08G 59/62* (2006.01)
  *C09D 133/12* (2006.01)
  *C09D 163/06* (2006.01)
  *H01L 21/027* (2006.01)

(52) U.S. Cl.
  CPC ......... *C08G 59/628* (2013.01); *C09D 133/12* (2013.01); *C09D 163/06* (2013.01); *H01L 21/0273* (2013.01)

(58) Field of Classification Search
  USPC ........................... 430/273.1, 277.1, 325–330
  See application file for complete search history.

(56) References Cited

U.S. PATENT DOCUMENTS

| | | | |
|---|---|---|---|
| 5,886,102 A | 3/1999 | Sinta et al. | |
| 6,033,830 A | 3/2000 | Sinta et al. | |
| 10,416,563 B2* | 9/2019 | Satoh | G03F 7/168 |
| 2004/0072420 A1* | 4/2004 | Enomoto | G03F 7/091 |
| | | | 438/636 |
| 2006/0047140 A1* | 3/2006 | Hayakawa | C08G 63/914 |
| | | | 560/217 |
| 2006/0155017 A1* | 7/2006 | Devadoss | C09D 5/34 |
| | | | 524/113 |
| 2008/0311511 A1* | 12/2008 | Senzaki | G03F 7/0045 |
| | | | 430/280.1 |
| 2010/0068649 A1* | 3/2010 | Senzaki | G03F 7/0045 |
| | | | 430/280.1 |
| 2013/0280656 A1* | 10/2013 | Lowes | G03F 7/095 |
| | | | 430/280.1 |
| 2020/0131376 A1* | 4/2020 | Tokunaga | C09D 5/00 |
| 2020/0201184 A1* | 6/2020 | Ogata | C08G 65/3322 |

FOREIGN PATENT DOCUMENTS

| | | | | |
|---|---|---|---|---|
| JP | 2007-99943 A | | 4/2007 | |
| JP | 2007-264483 A | | 10/2007 | |
| JP | 4145972 B2 | | 9/2008 | |
| JP | 2009-169085 A | | 7/2009 | |
| JP | 2014-174428 A | | 9/2014 | |
| JP | 2016-99374 A | | 5/2016 | |
| JP | 2018173521 A | * | 11/2018 | ........... C07D 251/32 |
| WO | 2005/013601 A1 | | 2/2005 | |
| WO | 2015/030060 A1 | | 3/2015 | |
| WO | 2016/084855 A1 | | 6/2016 | |

OTHER PUBLICATIONS

Catechol, 99%, Alfa Aesar | Fisher Scientific, downloaded from world wide web on Jan. 27, 2021, 3 pages (Year: 2021).*
Japanese Patent application No. 2017-071098 filed Mar. 31, 2017 obtained from www.wiipo.int ,WIPO IP Portal from application file of published Japanese patent document JP 2018173521A, 73 pages. (Year: 2018).*
English translation of Japanese Patent application No. 2017-071098 filed Mar. 31, 2017 obtained from www.wiipo.int ,WIPO IP Portal from application file of published Japanese patent document JP 2018173521A, 78 pages (Year: 2021).*
Dec. 19, 2017 International Search Report issued in International Patent Application No. PCT/JP2017/033524.
Dec. 19, 2017 Written Opinion issued in International Patent Application No. PCT/JP2017/033524.
May 6, 2021 Office Action issued in Taiwanese Patent Application No. 106131748.

* cited by examiner

PROTECTIVE FILM-FORMING COMPOSITION

TECHNICAL FIELD

The present invention relates to a composition used in a lithography process to form a protective film having high resistance to aqueous hydrogen peroxide solutions. The present invention further relates to a method of forming a pattern using the protective film.

BACKGROUND ART

A lithography process is known that a resist underlayer film is provided between a substrate and a resist film formed above the substrate in order to form a resist pattern of desired shape. However, conventional resist underlayer films, such as a resist underlayer film described in Patent Document 1 which is formed from a composition containing an aminoplast crosslinker, have poor resistance to aqueous hydrogen peroxide solutions. Such a resist underlayer film cannot, therefore, be used as a mask in a wet etching process using an aqueous hydrogen peroxide solution.

Patent Document 2 listed below describes: an underlayer film-forming composition for lithography, the composition containing a compound having protected carboxyl group, a compound having a group reactive with carboxyl group, and a solvent; or an underlayer film-forming composition for lithography, the composition containing a compound and a solvent, the compound having a group reactive with carboxyl group and protected carboxyl group. These compositions do not contain an aminoplast crosslinker as an essential component. However, Patent Document 2 gives no description or suggestion as to the resistance to aqueous hydrogen peroxide solutions of resist underlayer films formed from the above compositions.

Patent Document 3 listed below describes a pattern formation method using a resist underlayer film having resistance to basic aqueous hydrogen peroxide solutions. The composition for forming this resist underlayer film contains a polymer and a solvent, the polymer having a weight-average molecular weight of 1,000 to 100,000 and having epoxy group.

PRIOR ART DOCUMENTS

Patent Documents

Patent Document 1: Japanese Patent No. 4145972
Patent Document 2: International Publication No. WO 2005/013601
Patent Document 3: International Publication No. WO 2015/030060

SUMMARY OF THE INVENTION

Problem to be Solved by the Invention

In recent years, there is an increasing demand for protective films having higher resistance to aqueous hydrogen peroxide solutions than conventional protective films. It is an object of the present invention to provide a novel composition for forming a protective film having resistance to aqueous hydrogen peroxide solutions and a pattern formation method using the protective film.

Means for Solving the Problem

The present inventors have achieved the above object by using a composition containing a compound having two or more phenolic hydroxy groups as an additive, i.e., as an auxiliary component or as a main component in solids excluding a solvent. A first aspect of the present invention is a composition for forming protective films against aqueous hydrogen peroxide solutions, the composition comprising: a compound of the following formula (1a) or formula (1b) or a compound having a substituent of the following formula (2) and having a molecular weight of 300 or more and less than 800 or a weight-average molecular weight of 300 or more and less than 800; and a solvent, the composition containing the compound of the formula (1a) or formula (1b) of 0.1% by mass to 60% by mass or the compound having the substituent of the formula (2) of 10% by mass to 100% by mass, relative to solids excluding the solvent.

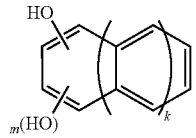
(1a)

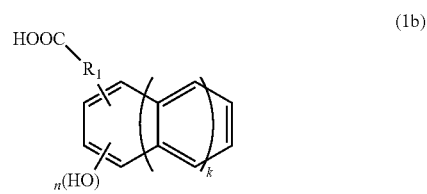
(1b)

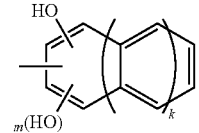
(2)

(wherein $R_1$ is a $C_{1-4}$ alkylene or alkenylene group or a direct bond, k is 0 or 1, m is an integer of 1 to 3, and n is an integer of 2 to 4.)

The protective film-forming composition of the present invention may further comprise a compound having at least two of epoxy group, oxetanyl group, epoxycyclohexyl group, or epoxycyclopentyl group per molecule. This compound is added as a crosslinker.

The protective film-forming composition of the present invention may further comprise a compound having no phenolic hydroxy group and, in this case, the composition contains the compound of the formula (1a) or formula (1b) of 0.1% by mass to 60% by mass relative to the compound having no phenolic hydroxy group. The phenolic hydroxy group refers to hydroxy group bonded to a benzene ring.

The compound having no phenolic hydroxy group may be any of a monomer, a dimer, a trimer, an oligomer, and a polymer. When this compound is a polymer, examples of the polymer include: a copolymer having a structural unit of the following formula (3), a structural unit of the following formula (4), and a structural unit of the following formula (5); and a copolymer having a structural unit of the following formula (6).

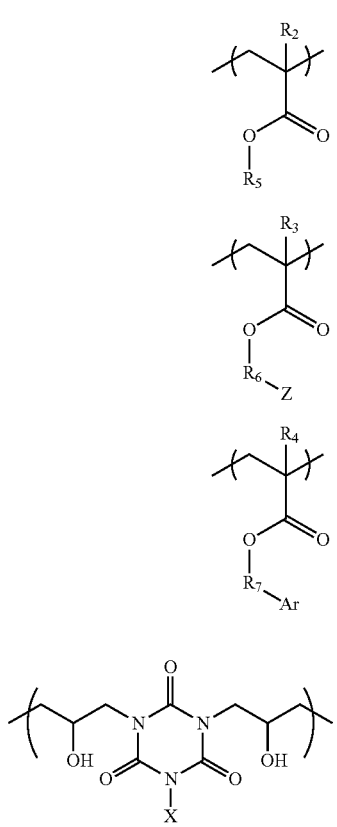

(wherein $R_2$, $R_3$, and $R_4$ are each independently hydrogen atom or methyl group, $R_5$ is a $C_{1-8}$ alkyl group or a $C_{2-8}$ alkoxyalkyl group, $R_6$ and $R_7$ are each independently a direct bond or a $C_{1-3}$ alkylene group, Z is epoxy group, epoxycyclohexyl group, or epoxycyclopentyl group, Ar is phenyl group, naphthyl group, or anthracenyl group, X is a $C_{1-6}$ alkyl group, allyl group, or glycidyl group, m and n are each independently 0 or 1, and Q is a divalent organic group optionally having at least one heteroatom selected from the group consisting of oxygen, sulfur, and nitrogen in a main chain.)

The protective film-forming composition of the present invention may further comprise an organic acid or another additive.

A second aspect of the present invention is a pattern formation method comprising:
  a first step of forming a protective film on a semiconductor substrate by using the composition for forming protective films against aqueous hydrogen peroxide solutions according to the first aspect of the present invention, wherein the semiconductor substrate optionally has an inorganic film formed on a surface of the semiconductor substrate;
  a second step of forming a resist pattern on the protective film;
  a third step of uncovering a surface of the inorganic film or the semiconductor substrate by dry-etching the protective film with the resist pattern serving as a mask; and
  a fourth step of wet-etching and cleaning the inorganic film or the semiconductor substrate by using an aqueous hydrogen peroxide solution with the dry-etched protective film serving as a mask.

Examples of the aqueous hydrogen peroxide solution include: a basic aqueous hydrogen peroxide solution containing ammonia, sodium hydroxide, potassium hydroxide, sodium cyanide, potassium cyanide, triethanolamine, or urea; and an acidic aqueous hydrogen peroxide solution containing hydrochloric acid or sulfuric acid. When the aqueous hydrogen peroxide solution is a basic aqueous hydrogen peroxide solution containing ammonia, the basic aqueous hydrogen peroxide solution is, for example, a mixture of 25% by mass to 30% by mass of aqueous ammonia solution (A), 30% by mass to 36% by mass of aqueous hydrogen peroxide solution (B), and water (C) and, in this case, the volume ratio (B)/(A) of the aqueous hydrogen peroxide solution (B) to the aqueous ammonia solution (A) is 0.1 to 20.0, and the volume ratio (C)/(A) of the water (C) to the aqueous ammonia solution (A) is 1.0 to 50.0.

Effects of the Invention

A protective film formed from the protective film-forming composition of the present invention has resistance to aqueous hydrogen peroxide solutions. The protective film formed from the protective film-forming composition of the present invention can therefore be used as a mask in etching and cleaning processes using an aqueous hydrogen peroxide solution.

MODES FOR CARRYING OUT THE INVENTION

The components contained in the protective film-forming composition of the present invention will be described in detail hereinafter.

[Compound of Formula (1a) or Formula (1b)]

Examples of the compound of the formula (1a) include compounds of the following formula (1a-1) to formula (1a-19).

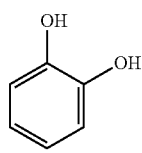
(1a-1)

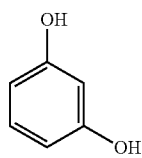
(1a-2)

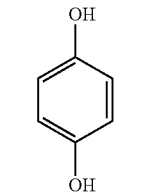
(1a-3)

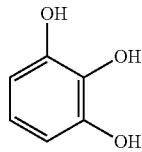
(1a-4)

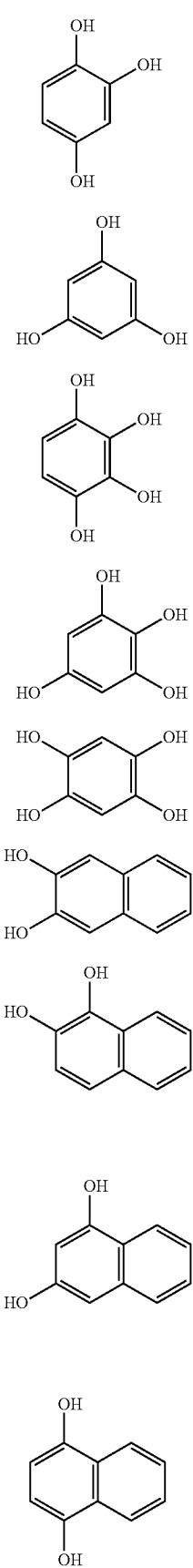
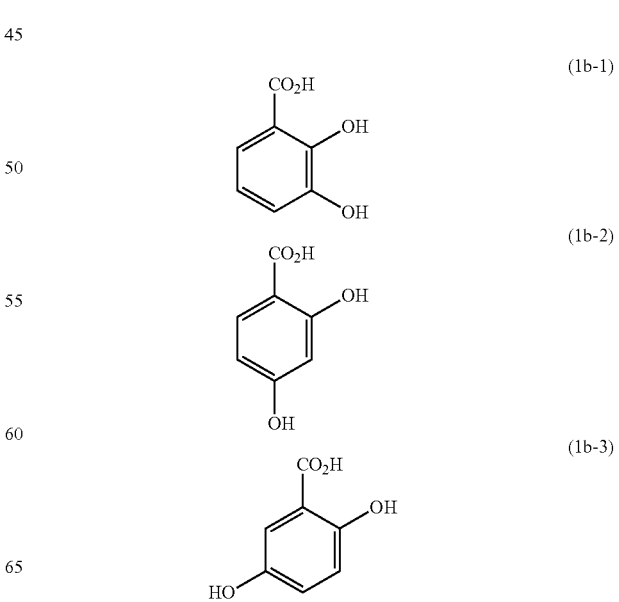
Examples of the compound of the formula (1b) include compounds of the following formula (1b-1) to formula (1b-31).

-continued
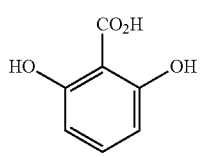
(1b-4)
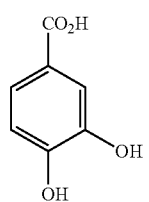
(1b-5)
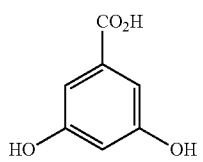
(1b-6)
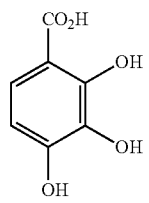
(1b-7)
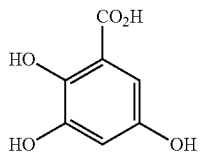
(1b-8)
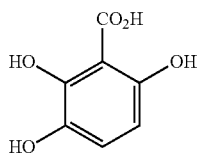
(1b-9)
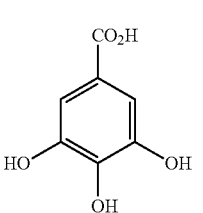
(1b-10)
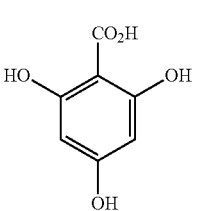
(1b-11)
-continued
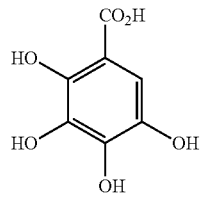
(1b-12)
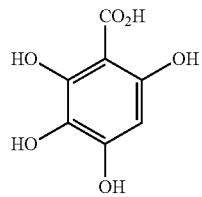
(1b-13)
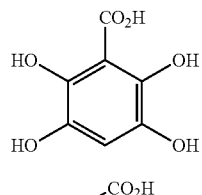
(1b-14)
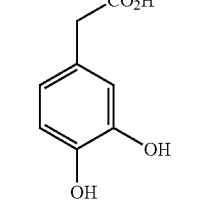
(1b-15)
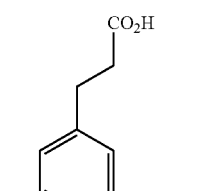
(1b-16)
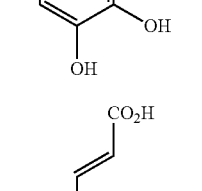
(1b-17)
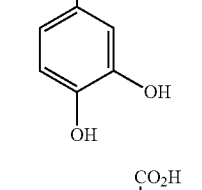
(1b-18)
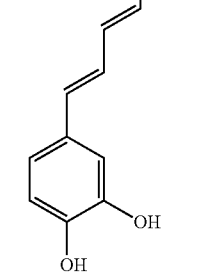

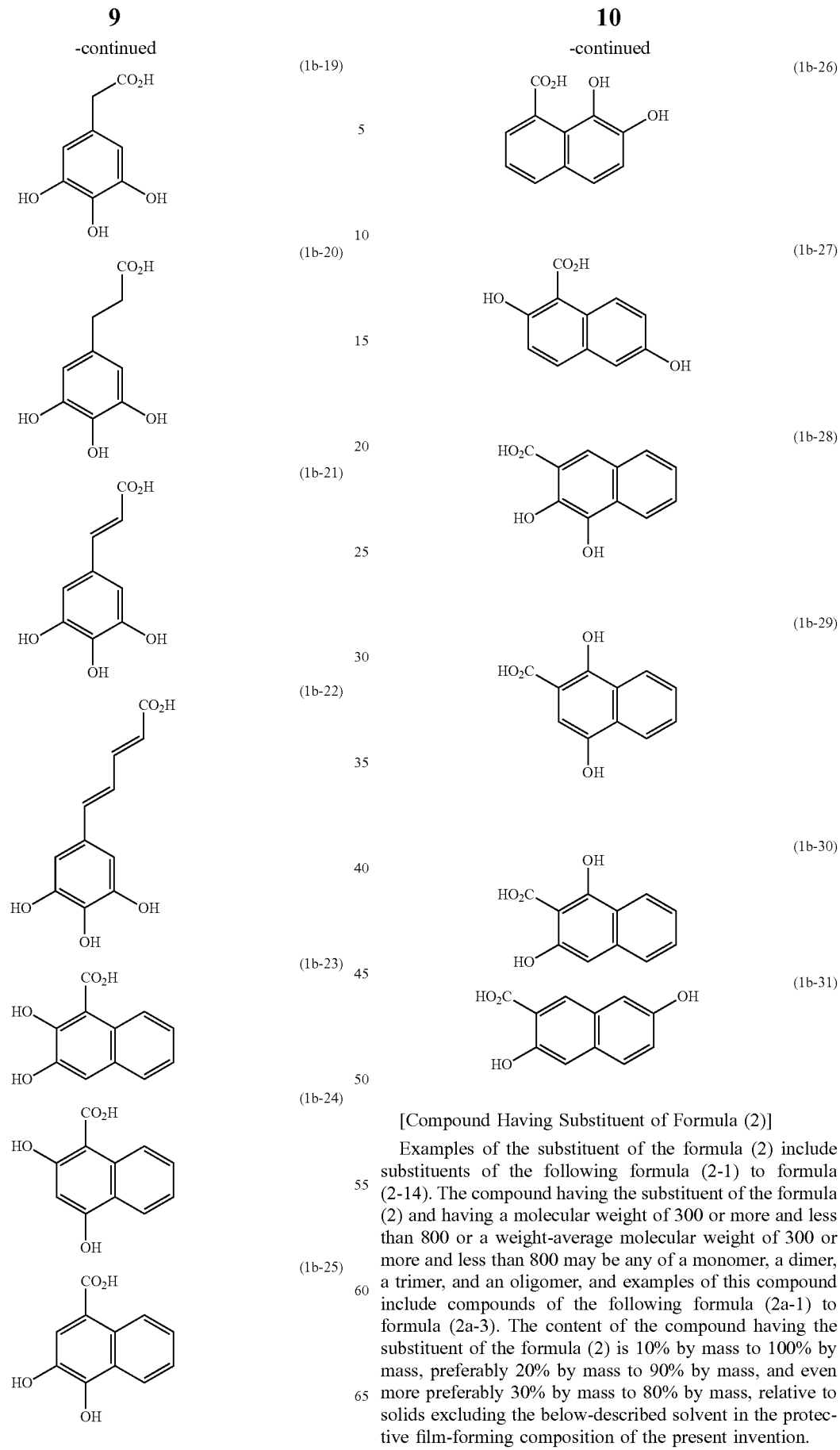

[Compound Having Substituent of Formula (2)]

Examples of the substituent of the formula (2) include substituents of the following formula (2-1) to formula (2-14). The compound having the substituent of the formula (2) and having a molecular weight of 300 or more and less than 800 or a weight-average molecular weight of 300 or more and less than 800 may be any of a monomer, a dimer, a trimer, and an oligomer, and examples of this compound include compounds of the following formula (2a-1) to formula (2a-3). The content of the compound having the substituent of the formula (2) is 10% by mass to 100% by mass, preferably 20% by mass to 90% by mass, and even more preferably 30% by mass to 80% by mass, relative to solids excluding the below-described solvent in the protective film-forming composition of the present invention.

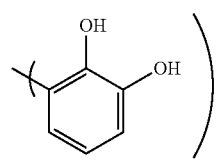 (2-1)
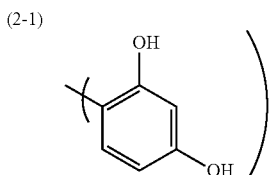 (2-2)
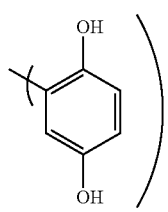 (2-3)
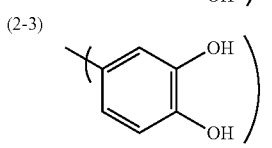 (2-4)
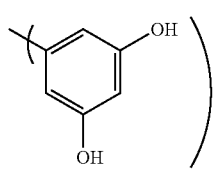 (2-5)
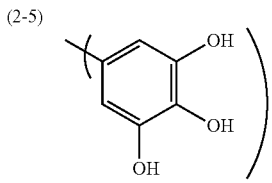 (2-6)
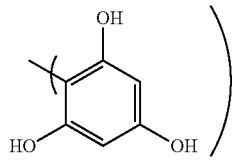 (2-7)
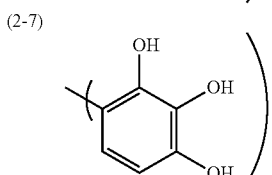 (2-8)
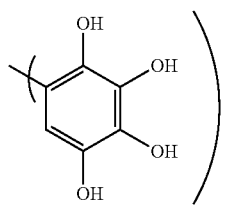 (2-9)
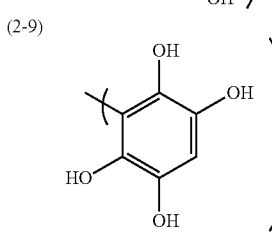 (2-10)
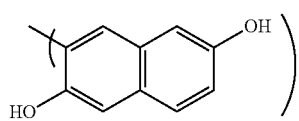 (2-11)
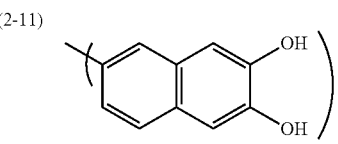 (2-12)
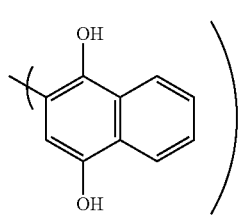 (2-13)
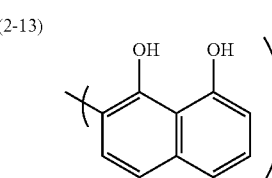 (2-14)
(2a-1)
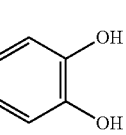
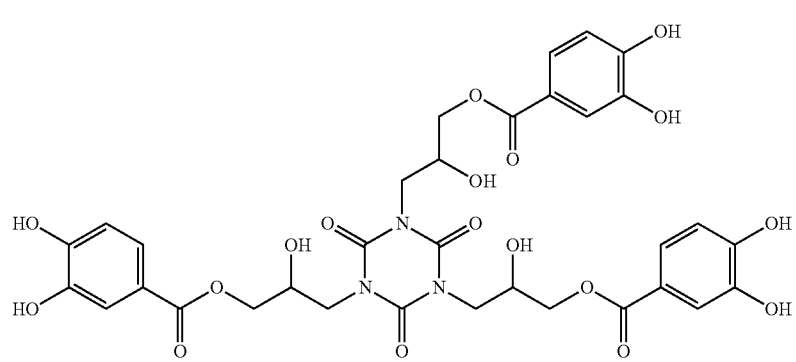

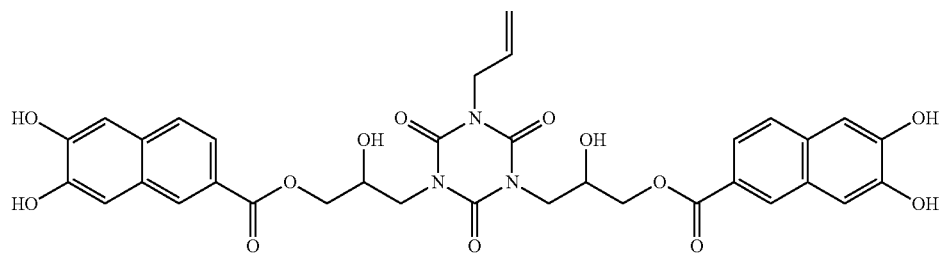
(2a-2)
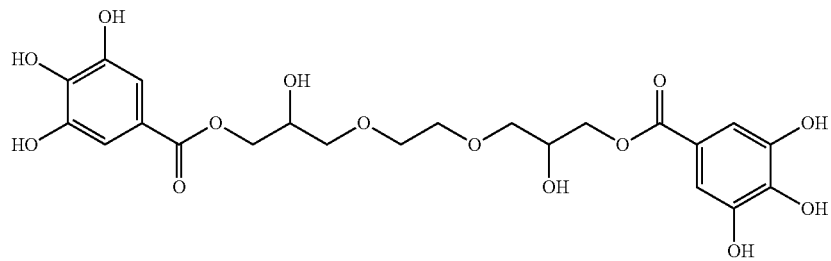
(2a-3)
[Compound Having No Phenolic Hydroxy Group]
When the compound having no phenolic hydroxy group, which may be optionally contained in the protective film-forming composition of the present invention, is a polymer, examples of the structural unit of the formula (3) include structural units of the following formula (3-1) to formula (3-9).
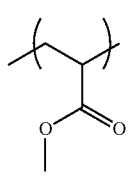
(3-1)
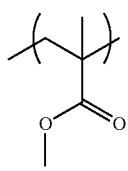
(3-2)
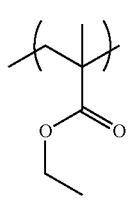
(3-3)
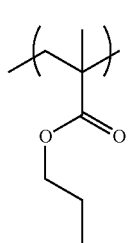
(3-4)
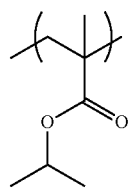
(3-5)
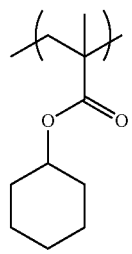
(3-6)
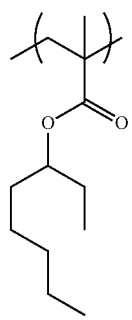
(3-7)
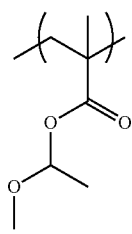
(3-8)

(3-9)
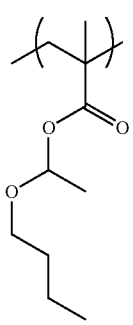
Examples of the structural unit of the formula (4) in the polymer having no phenolic hydroxy group include structural units of the following formula (4-1) to formula (4-7).
(4-1)
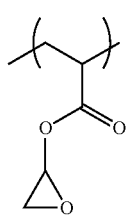
(4-2)
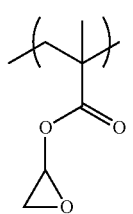
(4-3)
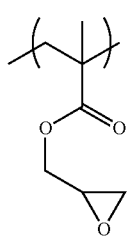
(4-4)
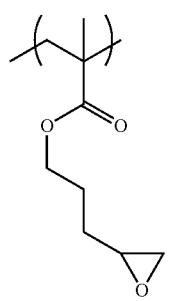
(4-5)
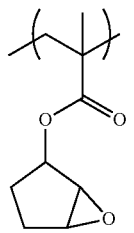
(4-6)
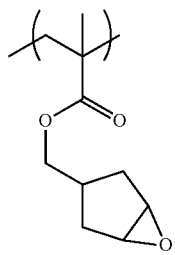
(4-7)
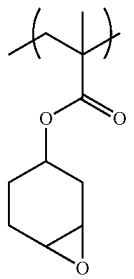
Examples of the structural unit of the formula (5) in the polymer having no phenolic hydroxy group include structural units of the following formula (5-1) to formula (5-9).
(5-1)
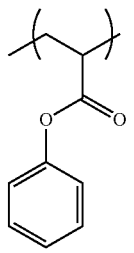
(5-2)
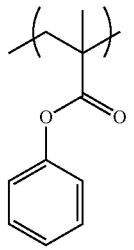

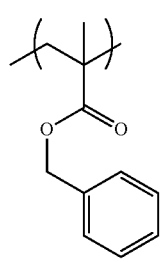
(5-3)
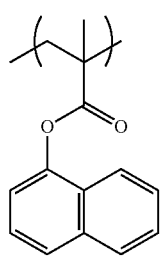
(5-4)
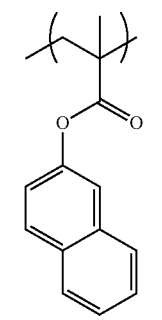
(5-5)
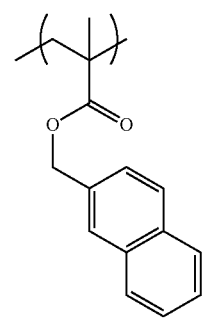
(5-6)
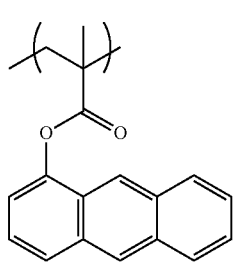
(5-7)
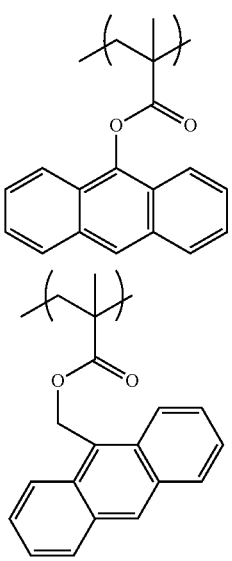
(5-8)
Examples of the polymer having no phenolic hydroxy group include the copolymers having a structural unit of the formula (3-2), a structural unit of the formula (3-9), a structural unit of the formula (4-3), or a structural unit of the formula (5-9) as mentioned bellow.
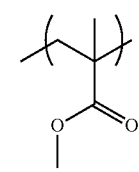
(3-2)
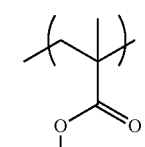
(3-9)
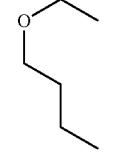
(4-3)
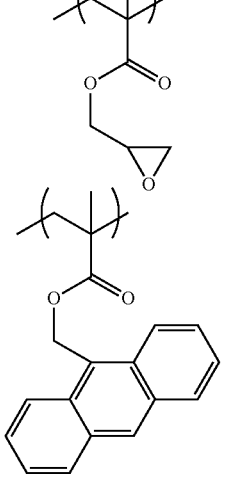
(5-9)

Examples of the compound having no phenolic hydroxy group include, in addition to the above copolymers, a copolymer having a structural unit of the following formula (6-1), a copolymer having a structural unit of the following formula (6-2), a copolymer having a structural unit of the following formula (6-3), a compound of the following formula (7), and a compound of the following formula (8).

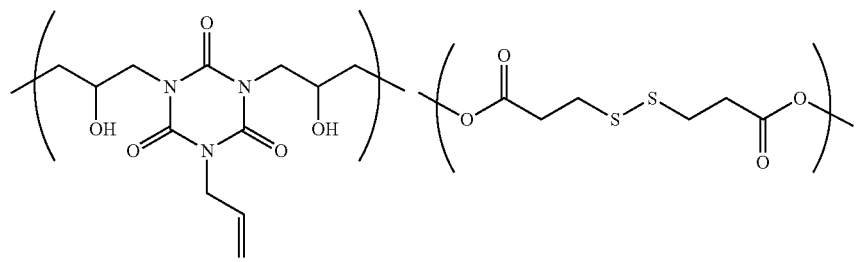
(6-1)

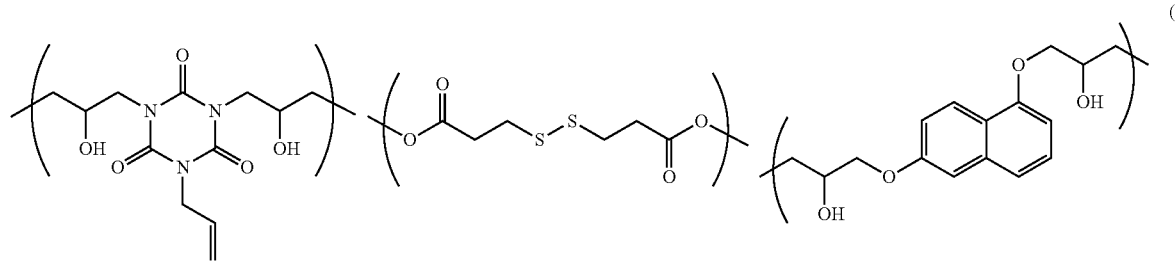
(6-2)

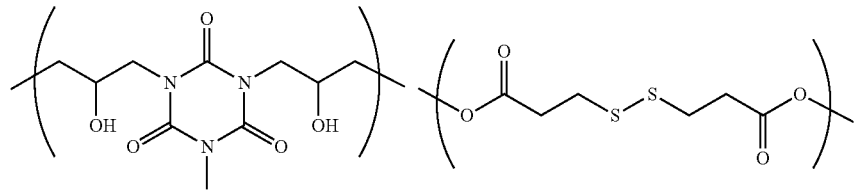
(6-3)

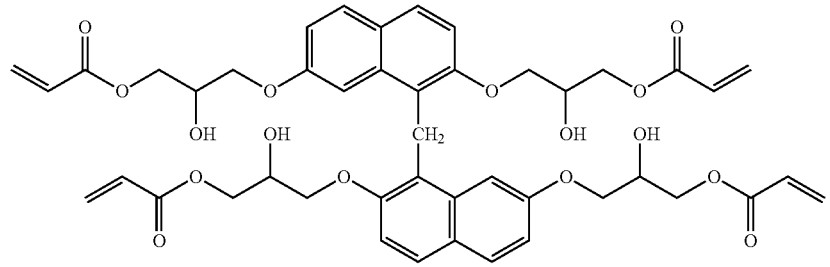
(7)

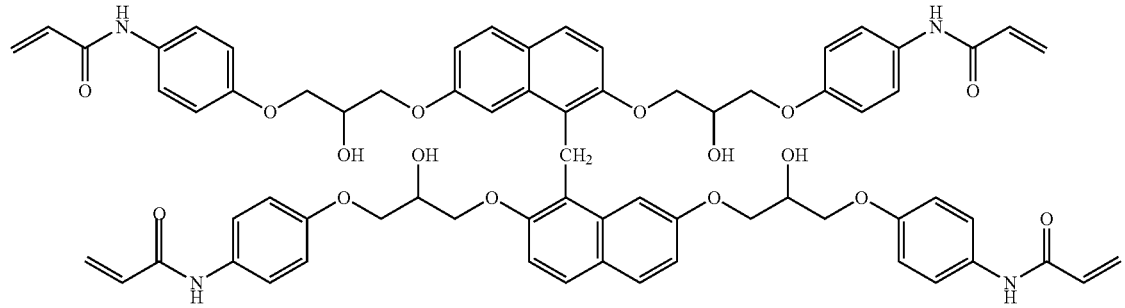
(8)

When the compound having no phenolic hydroxy group is a polymer, the weight-average molecular weight of this polymer, as determined by gel permeation chromatography using polystyrene as a standard sample, is 1,000 to 200,000, for example.

[Crosslinker]

Examples of the compound having at least two of epoxy group, oxetanyl group, epoxycyclohexyl group, or epoxycyclopentyl group per molecule, which may be optionally contained in the protective film-forming composition of the present invention, include tris(2,3-epoxypropyl) isocyanurate, 1,4-butanediol diglycidyl ether, glycerol triglycidyl ether, diethylene glycol diglycidyl ether, diglycidyl 1,2-cyclohexanedicarboxylate, 1,2-epoxy-4-(epoxyethyl)cyclohexane, 4,4'-methylenebis[N,N-bis(oxiranylmethyl)aniline], trimethylolpropane triglycidyl ether, bisphenol-A-diglycidyl ether, and 1,3,4,6-tetraglycidyl glycoluril, and further include: TEPIC (registered trademark)-L, TEPIC-SS, TEPIC-PAS B26L, TEPIC-PAS B22, TEPIC-VL, and TEPIC-UC, available from Nissan Chemical Industries, Ltd.; EPOFRIEND AT501, EPOFRIEND CT301, CELLOXIDE (registered trademark) 2021, CELLOXIDE 2081, CELLOXIDE 8000, EPOLEAD (registered trademark) GT-401, EPOLEAD P133600, EPOLEAD P134700, EHPE 3150, and EHPE 3150CE, available from Daicel Corporation; 152, 154, 157S70, 168V70, 604, 630, 801N, 801PN, 802, 806, 807, 811, 813, 816A, 816C, 819, 825, 827, 828, 828EL, 828US, 828XA, 834X90, 871, 872, 1001, 1002, 1003, 1004, 1007, 1009, 1010, 1031S, 1032H60, 1256, 4004P, 4005P, 4007P, 4010P, 4250, 4275, 5046B80, YL980, YL983U, YL6810, YL6121L, YX4000, YX4000H, YX8000, YX8034, and YX8800, available from Mitsubishi Chemical Corporation; NC-3000, NC-3000-L, NC-3000-H, NC-3000-FH-75M, NC-3100, CER-3000-L, NC-2000-L, XD-1000, NC-7000L, NC-7300L, EPPN-50111, EPPN-501HY, EPPN-502H, EOCN-1020, EOCN-102S, EOCN-103S, EOCN-104S, CER-1020, EPPN201, BREN-S, BREN-105, GAN, GOT, RE-303S-L, and RE-310S, available from Nippon Kayaku Co., Ltd.; DENACOL (registered trademark) EX-211, DENACOL EX-212, DENACOL EX-252, DENACOL EX-810, DENACOL EX-811, DENACOL EX-850, DENACOL EX-851, DENACOL EX-821, DENACOL EX-830, DENACOL EX-832, DENACOL EX-841, DENACOL EX-861, DENACOL EX-911, DENACOL EX-941, DENACOL EX-920, DENACOL EX-931, DENACOL EX-313, DENACOL EX-314, DENACOL EX-321, DENACOL EX-411, DENACOL EX-421, DENACOL EX-512, DENACOL EX-612, and DENACOL EX-614, available from Nagase Chemtex Corporation; CY175, CY177, CY179, CY182, CY184, and CY192, available from BASF Japan Ltd.; EPICLON 840, EPICLON 804-S, EPICLON 850, EPICLON 850-S, EPICLON 850-CRP, EPICLON 850-LC, EPICLON 860, EPICLON 1050, EPICLON 1055, EPICLON 3050, EPICLON 4050, EPICLON 7050, EPICLON AM-020-P, EPICLON AM-040-P, EPICLON HM-091, EPICLON HM-101, EPICLON 830, EPICLON 830-8, EPICLON EXA-830LVP, EPICLON 835, EPICLON EXA-835LV, EPICLON 1051-75M, EPICLON 7070-40K, EPICLON HM-091-40AX, EPICLON 152, EPICLON 153, EPICLON 153-60T, EPICLON 153-60M, EPICLON 1121N-80M, EPICLON 1123P-75M, EPICLON N-660, EPICLON N-665, EPICLON N-670, EPICLON N-673, EPICLON N-680, EPICLON N-695, EPICLON N-655-EXP-S, EPICLON N-662-EXP-S, EPICLON N-665-EXP, EPICLON N-672-EXP, EPICLON N-670-EXP-S, EPICLON N-685-EXP-S, EPICLON N-673-80M, EPICLON N-680-75M, EPICLON N-690-75M, EPICLON N-740, EPICLON N-770, EPICLON N-775, EPICLON N-865, EPICLON HP-4032, EPICLON HP-4032D, EPICLON HP-4700, EPICLON HP-4710, EPICLON HP-4770, EPICLON HP-5000, EPICLON HP-7200, EPICLON HP-7200H, EPICLON HP-820, EPICLON 5500, and EPICLON 5800, available from DIC Corporation; MA-DGIC, DAG-G, and TG-G, available from Shikoku Chemicals Corporation; and EPOTOHTO (registered trademark) YD-127, EPOTOHTO YD-128, EPOTOHTO YDF-170, EPOTOHTO YD-8125, EPOTOHTO YDF-8170C, EPOTOHTO ZX-1059, EPOTOHTO YD-825GS, EPOTOHTO YD-825GSH, EPOTOHTO YDF-870GS, EPOTOHTO YDPN-138, EPOTOHTO YDCN-700, EPOTOHTO YDC-1312, EPOTOHTO YSLV-80XY, EPOTOHTO YSLV-120TE, EPOTOHTO ST-3000, EPOTOHTO ST-4000D, EPOTOHTO YD-171, EPOTOHTO YH-434, EPOTOHTO YH-434L, EPOTOHTO FX-289BEK75, EPOTOHTO FX-305EK70, and EPOTOHTO ERF-001M30, available from Nippon Steel & Sumikin Chemical Co., Ltd.

When the protective film-forming composition of the present invention comprises the compound having at least two of epoxy group, oxetanyl group, epoxycyclohexyl group, or epoxycyclopentyl group per molecule, the content of this compound is, for example, 1% by mass to 80% by mass relative to solids excluding the below-described solvent in the protective film-forming composition.

[Organic Acid]

The protective film-forming composition of the present invention may contain an organic acid as an optional component. Examples of the organic acid include sulfonic acid compounds and carboxylic acid compounds, such as p-toluenesulfonic acid, trifluoromethanesulfonic acid, pyridinium p-toluenesulfonate, pyridinium trifluoromethanesulfonate, salicylic acid, camphorsulfonic acid, 5-sulfosalicylic acid, 4-chlorobenzenesulfonic acid, 4-phenolsulfonic acid, methyl 4-phenolsulfonate, benzenedisulfonic acid, 1-naphthalenesulfonic acid, citric acid, and benzoic acid. One of these organic acids may be contained alone, or two or more of the organic acids may be contained in combination. When the protective film-forming composition of the present invention comprises an organic acid, the content of the organic acid is, for example, 0.01% by mass to 10% by mass relative to solids excluding the below-described solvent in the protective film-forming composition.

[Solvent]

The protective film-forming composition of the present invention can be prepared by dissolving the above components in a solvent and is used in the form of a homogeneous solution. Examples of the solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monoethyl ether, propylene glycol monomethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. One of these solvents may be used alone, or two or more of the solvents may be used in combination.

[Additional Component]

The protective film-forming composition of the present invention may contain a surfactant as an optional component in order to achieve improved application property on semiconductor substrates. Examples of the surfactant include nonionic surfactants such as: polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenyl ether and polyoxyethylene nonylphenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate: fluorinated surfactants such as: Eftop (registered trademark) EF301, Eftop EF303, and Eftop EF352 (available from Mitsubishi Materials Electronic Chemicals Co., Ltd.); MEGAFACE (registered trademark) F171, MEGAFACE F173, MEGAFACE R-30, MEGAFACE R-30N, MEGAFACE R-40, and MEGAFACE R-40-LM (available from DIC Corporation); Fluorad FC430 and Fluorad FC431 (available from Sumitomo 3M Ltd.); AsahiGuard (registered trademark) AG710, and SURFLON (registered trademark) S-382, SURFLON SC101, SURFLON SC102, SURFLON SC103, SURFLON SC104, SURFLON SC105, and SURFLON SC106 (available from Asahi Glass Co., Ltd.); organosiloxane polymer KP341 (available from Shin-Etsu Chemical Co., Ltd.). One of these surfactants may be used alone, or two or more of the surfactants may be used in combination. When the protective film-forming composition of the present invention contains a surfactant, the content of the surfactant is, for example, 0.01% by mass to 10% by mass relative to solids excluding the below-described solvent in the protective film-forming composition.

The protective film-forming composition as prepared is preferably filtered through a filter with a pore diameter of 0.2 μm or 0.1 μm and/or a filter with a pore diameter of 0.01 μm before use.

A pattern formation method using the protective film-forming composition of the present invention will be described hereinafter.

Examples of the semiconductor substrate to which the protective film-forming composition of the present invention is applied include silicon substrates, germanium substrates, and wafers of compound semiconductors such as gallium arsenide, indium phosphide, gallium nitride, indium nitride, and aluminum nitride. In the case of using a semiconductor substrate having an inorganic film formed on the surface thereof, the inorganic film is formed, for example, by atomic layer deposition (ALD) method, chemical vapor deposition (CVD) method, reactive sputtering method, ion plating method, vacuum deposition method, or spin coating method (spin-on-glass: SOG). Examples of the inorganic film include a polysilicon film, a silicon oxide film, a silicon nitride film, a boro-phospho-silicate glass (BPSG) film, a titanium nitride film, a titanium oxynitride film, a tungsten film, a gallium nitride film, and a gallium arsenide film.

The protective film-forming composition of the present invention is applied onto such a semiconductor substrate by appropriate application means such as a spinner or coater. The applied composition is then baked with heating means such as a hot plate to form a protective film. As for the bake conditions, the bake temperature is selected as appropriate within the range of 100° C. to 400° C., and the bake time is selected as appropriate within the range of 0.3 minutes to 60 minutes. Preferably, the bake temperature is 120° C. to 350° C., and the bake time is 0.5 minutes to 30 minutes, more preferably, the bake temperature is 150° C. to 300° C., and the bake time is 0.8 minutes to 10 minutes. The thickness of the protective film formed is, for example, 0.001 μm to 10 μm, preferably 0.002 μm to 1 μm, and more preferably 0.005 μm to 0.5 μm. If the temperature during bake is below the above range, the resulting cross-linking may be insufficient, so that the protective film formed may fail to attain resistance to resist solvents or aqueous hydrogen peroxide solutions. If the temperature during bake is beyond the above range, the protective film may be decomposed by heat.

Next, a resist pattern is formed on the protective film. The formation of the resist pattern can be accomplished through common processes, i.e., application of a photoresist solution to the protective film, followed by prebake, exposure, post-exposure bake abbreviated as PEB (if necessary), development, and rinsing. The photoresist solution used for the formation of the resist pattern is not particularly limited as long as the solution is sensitive to light used in exposure, and a positive photoresist can be used. Examples of the photoresist include: a chemically amplified photoresist consisting of a binder having a group degradable by an acid to increase the alkali dissolution rate and a photoacid generator; a chemically amplified photoresist consisting of a low-molecular-weight compound degradable by an acid to increase the alkali dissolution rate of the photoresist, an alkali-soluble binder, and a photoacid generator; a chemically amplified photoresist consisting of a binder having a group degradable by an acid to increase the alkali dissolution rate, a low-molecular-weight compound degradable by an acid to increase the alkali dissolution rate of the photoresist, and a photoacid generator; and a DNQ-novolac non-chemically amplified photoresist designed to exploit the difference in alkali dissolution rate between an exposed region and an unexposed region. Specific examples include a photoresist available from Sumitomo Chemical Co., Ltd. under the trade name PAR710, photoresists available from Tokyo Ohka Kogyo, Co., Ltd. under the trade names TDUR-P3435LP and THMR-iP1800, and a photoresist available from Shin-Etsu Chemical Co., Ltd under the trade name SEPR430. A negative photoresist may also be used instead of such a positive photoresist.

The exposure is carried out through a mask (reticle) for forming a given pattern, and in the exposure, for example, i-ray, KrF excimer laser, ArF excimer laser, extreme ultraviolet (EUV), or electron beam (EB) is used. For the development, an alkaline developer is used, and the development temperature and development time are selected as appropriate within the range of 5° C. to 50° C. and within the range of 10 seconds to 300 seconds. Examples of the alkaline developer include alkaline aqueous solutions such as: aqueous solutions of alkali metal hydroxides such as potassium hydroxide and sodium hydroxide; aqueous solutions of quaternary ammonium hydroxides such as tetramethylammonium hydroxide, tetraethylammonium hydroxide, and choline; and aqueous solutions of amines such as ethanolamine, propylamine, and ethylenediamine. Further, a surfactant may be added to these developers. Alternatively, a development method can be employed in which an organic solvent such as butyl acetate is used instead of any alkaline developer to develop the region of the photoresist where the alkali dissolution rate has not been increased.

Next, the protective film is dry-etched with the formed resist pattern serving as a mask. When the inorganic film as described above is formed on the surface of the semiconductor substrate used, the dry etching uncovers the surface of the inorganic film, while when the inorganic film is not formed on the surface of the semiconductor substrate used, the dry etching uncovers the surface of the semiconductor substrate.

Further, wet etching is performed using an aqueous hydrogen peroxide solution with the dry-etched protective film (and the resist pattern if the resist pattern remains on the protective film) serving as a mask, and thus a desired pattern is formed. Examples of the chemical liquid for the wet etching include: a basic aqueous hydrogen peroxide solution prepared by mixing a basic substance such as ammonia, sodium hydroxide, potassium hydroxide, sodium cyanide, potassium cyanide, or an organic amine such as triethanolamine with a hydrogen peroxide solution to give a basic pH; and an acidic aqueous hydrogen peroxide solution prepared by mixing an inorganic acid such as hydrochloric acid or sulfuric acid with a hydrogen peroxide solution. Alternatively, a solution capable of changing its pH to a basic pH can be used as the chemical liquid for the wet etching; for example, it is possible to use a solution prepared by mixing urea and a hydrogen peroxide solution and capable of eventually presenting a basic pH through ammonia formation resulting from thermal decomposition of urea induced by heating. The temperature at which the basic aqueous hydrogen peroxide solution and acidic aqueous hydrogen peroxide solution are used is desirably 25° C. to 90° C. and more desirably 40° C. to 80° C. The wet etching time is desirably 0.5 minutes to 30 minutes and more desirably 1 minute to 20 minutes.

EXAMPLES

The weight-average molecular weights of polymers as described in Synthesis Example 1 to Synthesis Example 6 below in the present specification are measurement results obtained by gel permeation chromatography (hereinafter abbreviated as GPC). For the measurement, a GPC apparatus available from Tosoh Corporation was used, and the measurement conditions etc. were as follows.
GPC columns: Shodex (registered trademark) KF803L, Shodex KF802, and Shodex KF801 (Showa Denko K.K.)
Column temperature: 40° C.
Solvent: Tetrahydrofuran (THF)
Flow rate: 1.0 ml/min
Standard sample: Polystyrene (available from Tosoh Corporation)

Synthesis Example 1

A mixed solution prepared by dissolving 6.30 g of 1-butoxyethyl methacrylate, 5.66 g of glycidyl methacrylate, 10.96 g of methyl methacrylate, 4.40 g of 9-anthracenylmethyl methacrylate, and 2.73 g of azoisobutyronitrile in 30.05 g of propylene glycol monomethyl ether was slowly added dropwise to 40.06 g of propylene glycol monomethyl ether heated to 80° C., and after the dropwise addition, the reaction was allowed to proceed at 80° C. for 2 hours, giving a solution containing a polymer (solids content: 30% by mass). GPC analysis of the obtained polymer revealed that the weight-average molecular weight of this polymer, calculated as a standard polystyrene equivalent, was 6000.

Synthesis Example 2

11.48 g of triglycidyl isocyanurate, 18.24 g of salicylic acid, and 0.28 g of ethyltriphenylphosphonium bromide were dissolved in 70.00 g of propylene glycol monomethyl ether, and then the reaction was allowed to proceed at 140° C. for 24 hours, giving a solution containing a reaction product (solids content: 30% by mass). GPC analysis of the obtained reaction product revealed that the weight-average molecular weight of the reaction product, calculated as a standard polystyrene equivalent, was 710.

Synthesis Example 3

11.48 g of triglycidyl isocyanurate, 18.24 g of 3-hydroxybenzoic acid, and 0.28 g of ethyltriphenylphosphonium bromide were dissolved in 70.00 g of propylene glycol monomethyl ether, and then the reaction was allowed to proceed at 140° C. for 24 hours, giving a solution containing a reaction product (solids content: 30% by mass). GPC analysis of the obtained reaction product revealed that the weight-average molecular weight of the reaction product, calculated as a standard polystyrene equivalent, was 720.

Synthesis Example 4

11.48 g of triglycidyl isocyanurate, 18.24 g of 4-hydroxybenzoic acid, and 0.28 g of ethyltriphenylphosphonium bromide were dissolved in 70.00 g of propylene glycol monomethyl ether, and then the reaction was allowed to proceed at 140° C. for 24 hours, giving a solution containing a reaction product (solids content: 30% by mass). GPC analysis of the obtained reaction product revealed that the weight-average molecular weight of the reaction product, calculated as a standard polystyrene equivalent, was 710.

Synthesis Example 5

10.72 g of triglycidyl isocyanurate, 19.01 g of 3,4-dihydroxybenzoic acid, and 0.26 g of ethyltriphenylphosphonium bromide were dissolved in 69.97 g of propylene glycol monomethyl ether, and then the reaction was allowed to proceed at 140° C. for 24 hours, giving a solution containing a reaction product (solids content: 30% by mass). GPC analysis of the obtained reaction product revealed that the weight-average molecular weight of the reaction product, calculated as a standard polystyrene equivalent, was 760.

Synthesis Example 6

10.72 g of triglycidyl isocyanurate, 19.01 g of 3,5-dihydroxybenzoic acid, and 0.26 g of ethyltriphenylphosphonium bromide were dissolved in 69.97 g of propylene glycol monomethyl ether, and then the reaction was allowed to proceed at 140° C. for 24 hours, giving a solution containing a reaction product (solids content: 30% by mass). GPC analysis of the obtained reaction product revealed that the weight-average molecular weight of the reaction product, calculated as a standard polystyrene equivalent, was 770.

Synthesis Example 7

27.72 g of monoallyl diglycidyl isocyanurate (available from Shikoku Chemicals Corporation, trade name: MA-DGIC), 18.00 g of 1,6-bis(2,3-epoxypropan-1-yloxy) naphthalene (available from DIC Corporation, trade name: HP-4032D), 38.07 g of 3,3'-dithiodipropionic acid (available from Sakai Chemical Industry Co., Ltd., trade name: DTDPA), and 3.06 g of ethyltriphenylphosphonium bromide as a catalyst were dissolved in 347.39 g of propylene glycol monomethyl ether, and then the reaction was allowed to proceed at 105° C. for 24 hours, giving a solution containing a polymer (solids content: 20% by mass). GPC analysis of the obtained polymer revealed that the weight-average molecular weight of the polymer, calculated as a standard polystyrene equivalent, was 3300.

Synthesis Example 8

34.91 g of propylene glycol monomethyl ether was added to 10.00 g of EPICLON HP-4700 (available from DIC Corporation), 4.37 g of acrylic acid, 0.56 g of ethyltriphenylphosphonium bromide, and 0.03 g of hydroquinone, and the mixture was heated under stirring in a nitrogen atmosphere at 100° C. for 21 hours to give a solution containing a reaction product (solids content: 30% by mass). To the resulting solution were added 15 g of a cation-exchange resin (trade name: DOWEX (registered trademark) 550A, Muromachi Technos Co., Ltd.) and 15 g of an anion-exchange resin (trade name: AMBERLITE (registered trademark) 15JWET, Organo Corporation), and ion exchange was carried out at room temperature for 4 hours. The cation-exchange resin and the anion-exchange resin were removed to obtain a solution containing a reaction product (solids content: 30% by mass). The obtained reaction product was a compound of the formula (7).

Synthesis Example 9

45.22 g of propylene glycol monomethyl ether was added to 9.00 g of EPICLON HP-4700 (available from DIC Corporation), 9.84 g of N-(4-hydroxyphenyl)methacrylamide, 1.04 g of ethyltriphenylphosphonium bromide, and 0.02 g of hydroquinone, and the mixture was heated under stirring in a nitrogen atmosphere at 100° C. for 25 hours to give a solution containing a reaction product (solids content: 30% by mass). To the solution were added 20 g of a cation-exchange resin (trade name: DOWEX (registered trademark) 550A, Muromachi Technos Co., Ltd.) and 20 g of an anion-exchange resin (trade name: AMBERLITE (registered trademark) 15JWET, Organo Corporation), and ion exchange was carried out at room temperature for 4 hours. The cation-exchange resin and the anion-exchange resin were removed to obtain a solution containing a reaction product (solids content: 30% by mass). The obtained reaction product was a compound of the formula (8).

Hereinafter, the present invention will be described in more detail by means of Examples. It should be noted that the present invention is not limited by the following description of Examples. Although a solution having the composition shown in Table 2 below was used as the basic aqueous hydrogen peroxide solution, the basic aqueous hydrogen peroxide solution used in the present invention is not limited to this composition.

Example 1

To 2.11 g of the polymer-containing solution as obtained in Synthesis Example 1 were added 0.01 g of gallic acid monohydrate and 17.88 g of propylene glycol monomethyl ether. The resulting solution was filtered through a microfilter made of polyethylene and having a pore diameter of 0.02 μm, and thus a protective film-forming composition was prepared.

Example 2

To 2.11 g of the polymer-containing solution as obtained in Synthesis Example 1 were added 0.01 g of 3,4-dihydroxybenzoic acid and 17.88 g of propylene glycol monomethyl ether. The resulting solution was filtered through a microfilter made of polyethylene and having a pore diameter of 0.02 μm, and thus a protective film-forming composition was prepared.

Example 3

To 2.11 g of the polymer-containing solution as obtained in Synthesis Example 1 were added 0.01 g of 3,5-dihydroxybenzoic acid and 17.88 g of propylene glycol monomethyl ether. The resulting solution was filtered through a microfilter made of polyethylene and having a pore diameter of 0.02 μm, and thus a protective film-forming composition was prepared.

Example 4

To 1.23 g of the reaction product-containing solution as obtained in Synthesis Example 5 were added 0.27 g of 1,3,4,6-tetraglycidyl glycoluril and 18.50 g of propylene glycol monomethyl ether. The resulting solution was filtered through a microfilter made of polyethylene and having a pore diameter of 0.02 μm, and thus a protective film-forming composition was prepared.

Example 5

To 1.23 g of the reaction product-containing solution as obtained in Synthesis Example 6 were added 0.27 g of 1,3,4,6-tetraglycidyl glycoluril and 18.50 g of propylene glycol monomethyl ether. The resulting solution was filtered through a microfilter made of polyethylene and having a pore diameter of 0.02 μm, and thus a protective film-forming composition was prepared.

Example 6

To 0.19 g of gallic acid monohydrate were added 0.45 g of 1,3,4,6-tetraglycidyl glycoluril and 19.36 g of propylene glycol monomethyl ether. The resulting solution was filtered through a microfilter made of polyethylene and having a pore diameter of 0.02 μm, and thus a protective film-forming composition was prepared.

Example 7

To 0.23 g of 3,4-dihydroxybenzoic acid were added 0.41 g of 1,3,4,6-tetraglycidyl glycoluril and 19.36 g of propylene glycol monomethyl ether. The resulting solution was filtered through a microfilter made of polyethylene and having a pore diameter of 0.02 μm, and thus a protective film-forming composition was prepared.

Example 8

To 0.23 g of 3,5-dihydroxybenzoic acid were added 0.41 g of 1,3,4,6-tetraglycidyl glycoluril and 19.36 g of propylene glycol monomethyl ether. The resulting solution was filtered through a microfilter made of polyethylene and having a pore diameter of 0.02 μm, and thus a protective film-forming composition was prepared.

Example 9

To 0.18 g of gallic acid monohydrate were added 0.46 g of 4,4-methylenebis[N,N-bis(oxiranylmethyl)aniline] and 19.36 g of propylene glycol monomethyl ether. The resulting solution was filtered through a microfilter made of polyethylene and having a pore diameter of 0.02 μm, and thus a protective film-forming composition was prepared.

Example 10

To 251.88 g of the polymer-containing solution as obtained in Synthesis Example 7 were added 1.60 g of pyridinium trifluoromethanesulfonate, 2.14 g of gallic acid monohydrate, 0.043 g of a surfactant (available from DIC Corporation, trade name: R-30N), and 494.34 g of propylene glycol monomethyl ether. The resulting solution was filtered through a microfilter made of polyethylene and having a pore diameter of 0.02 µm, and thus a protective film-forming composition was prepared.

Example 11

To 1.00 g of the reaction product-containing solution as obtained in Synthesis Example 8 were added 0.01 g of gallic acid monohydrate, 0.0003 g of a surfactant (available from DIC Corporation, trade name: R-40), 0.996 g of propylene glycol monomethyl ether acetate, and 2.32 g of propylene glycol monomethyl ether. The resulting solution was filtered through a microfilter made of polyethylene and having a pore diameter of 0.02 µm, and thus a protective film-forming composition was prepared.

Example 12

To 1.00 g of the reaction product-containing solution as obtained in Synthesis Example 9 were added 0.01 g of gala acid monohydrate, 0.00023 g of a surfactant (available from DIC Corporation, trade name: R-40), 0.928 g of propylene glycol monomethyl ether acetate, and 2.17 g of propylene glycol monomethyl ether. The resulting solution was filtered through a microfilter made of polyethylene and having a pore diameter of 0.02 µm, and thus a protective film-forming composition was prepared.

Comparative Example 1

To 2.13 g of the polymer-containing solution as obtained in Synthesis Example 1 was added 17.87 g of propylene glycol monomethyl ether. The resulting solution was filtered through a microfilter made of polyethylene and having a pore diameter of 0.02 µm, and thus a film-forming composition was prepared.

Comparative Example 2

To 2.11 g of the polymer-containing solution as obtained in Synthesis Example 1 were added 0.01 g of 3-hydroxybenzoic acid and 17.88 g of propylene glycol monomethyl ether. The resulting solution was filtered through a microfilter made of polyethylene and having a pore diameter of 0.02 µm, and thus a film-forming composition was prepared.

Comparative Example 3

To 1.53 g of the reaction product-containing solution as obtained in Synthesis Example 2 were added 0.18 g of 1,3,4,6-tetraglycidyl glycoluril and 18.29 g of propylene glycol monomethyl ether. The resulting solution was filtered through a microfilter made of polyethylene and having a pore diameter of 0.02 µm, and thus a film-forming composition was prepared.

Comparative Example 4

To 1.53 g of the reaction product-containing solution as obtained in Synthesis Example 3 were added 0.18 g of 1,3,4,6-tetraglycidyl glycoluril and 18.29 g of propylene glycol monomethyl ether. The resulting solution was filtered through a microfilter made of polyethylene and having a pore diameter of 0.02 µm, and thus a film-forming composition was prepared.

Comparative Example 5

To 1.53 g of the reaction product-containing solution as obtained in Synthesis Example 4 were added 0.18 g of 1,3,4,6-tetraglycidyl glycoluril and 18.29 g of propylene glycol monomethyl ether. The resulting solution was filtered through a microfilter made of polyethylene and having a pore diameter of 0.02 µm, and thus a film-forming composition was prepared.

Comparative Example 6

To 0.27 g of salicylic acid were added 0.37 g of 1,3,4,6-tetraglycidyl glycoluril and 19.36 g of propylene glycol monomethyl ether. The resulting solution was filtered through a microfilter made of polyethylene and having a pore diameter of 0.02 µm, and thus a film-forming composition was prepared.

Comparative Example 7

To 0.27 g of 3-hydroxybenzoic acid were added 0.37 g of 1,3,4,6-tetraglycidyl glycoluril and 19.36 g of propylene glycol monomethyl ether. The resulting solution was filtered through a microfilter made of polyethylene and having a pore diameter of 0.02 µm, and thus a film-forming composition was prepared.

Comparative Example 8

To 0.27 g of 4-hydroxybenzoic acid were added 0.37 g of 1,3,4,6-tetraglycidyl glycoluril and 19.36 g of propylene glycol monomethyl ether. The resulting solution was filtered through a microfilter made of polyethylene and having a pore diameter of 0.02 µm, and thus a film-forming composition was prepared.

Comparative Example 9

To 1.00 g of the reaction product-containing solution as obtained in Synthesis Example 8 were added 0.00025 g of a surfactant (available from DIC Corporation, trade name: R-40), 1.52 g of propylene glycol monomethyl ether acetate, and 3.54 g of propylene glycol monomethyl ether. The resulting solution was filtered through a microfilter made of polyethylene and having a pore diameter of 0.02 µm, and thus a film-forming composition was prepared.

Comparative Example 10

To 1.00 g of the reaction product-containing solution as obtained in Synthesis Example 9 were added 0.00023 g of a surfactant (fluorinated surfactant, available from DIC Corporation, trade name: R-40), 1.01 g of propylene glycol monomethyl ether acetate, and 2.36 g of propylene glycol monomethyl ether. The resulting solution was filtered through a microfilter made of polyethylene and having a pore diameter of 0.02 µm, and thus a film-forming composition was prepared.

(Formation of Coating Film)

The protective film-forming compositions prepared in Example 1 to Example 10 and the film-forming compositions prepared in Comparative Example 1 to Comparative Example 8 were individually applied by spin coating to a silicon substrate or to a silicon substrate having a titanium nitride film formed on the surface thereof, and the applied composition was baked at 220° C. for 60 seconds to make a 100 nm-thick coating film.

(Test of Dissolution into Photoresist Solvent)

Each of the coating films made on a silicon substrate by using the protective film-forming compositions prepared in Example 1 to Example 10 was immersed for 1 minute in OK73 thinner (available from Tokyo Ohka Kogyo, Co., Ltd.; a mixture containing propylene glycol monomethyl ether and propylene glycol monomethyl ether acetate at a ratio of 7:3 (mass ratio)) which is used as a solvent for photoresist application. The change in thickness of the coating film before and after immersion was observed to be 5% or less. This result demonstrates that the coating films made using the protective film-forming compositions prepared in Example 1 to Example 10 allow a resist or a resist underlayer film to be laminated on the coating films.

Each of the protective film-forming compositions prepared in Example 11 and Example 12 was applied (spin-coated) onto a silicon substrate using a spinner and was baked on a hot plate at 240° C. for 90 seconds to form a 110 nm-thick coating film. This coating film was irradiated with ultraviolet light at 500 mJ/cm$^2$ by means of an ultraviolet irradiator (available from Ushio Inc.) employing a UV irradiation unit (wavelength: 172 nm), and subsequently the thickness of the cured coating film was measured. The ultraviolet-irradiated coating film was immersed in OK73 thinner described above for 1 minute, then spin-dried, and subsequently baked at 100° C. for 1 minute, after which the thickness of the coating film was measured again. The results are shown in Table 1 below.

TABLE 1

Evaluation of Solvent Resistance of UV-Cured Coating Film

| | Thickness after UV irradiation/nm | Thickness after solvent immersion/nm | Thickness change/nm |
|---|---|---|---|
| Example 11 | 107.6 | 107.0 | −0.6 |
| Example 12 | 106.3 | 105.4 | −0.9 |

The results of Table 1 above confirmed that the change in thickness of the ultraviolet-irradiated coating films before and after solvent immersion was 5% or less. This result demonstrates that the coating films made using the protective film-forming compositions prepared in Example 11 and Example 12 allow a resist or a resist underlayer film to be laminated on the coating films.

(Test of Dissolution into Resist Developer)

Each of the coating films made on a silicon substrate by using the protective film-forming compositions prepared in Example 1 to Example 10 was immersed for 1 minute in NMD-3 (available from Tokyo Ohka Kogyo, Co., Ltd.) which is a developer used for photoresist development. The change in thickness of the coating film before and after immersion was observed to be 5% or less.

(Test of Resistance to Basic Aqueous Hydrogen Peroxide Solution)

Each of the coating films made on a silicon substrate with a titanium nitride film on the surface thereof by using the protective film-forming compositions prepared in Example 1 to Example 10 and the film-forming compositions prepared in Comparative Example 1 to Comparative Example 8 was immersed in a basic aqueous hydrogen peroxide solution having the composition shown in Table 2 below at the temperature indicated in this table for 3 minutes, after which the coating film was washed with water and dried. The state of the dried coating film was visually examined. The results are shown in Table 3. In Table 3, "○" indicates that no peeling was found in the coating film after the three-minute treatment, while "x" indicates that peeling was observed in a part or the whole of the coating film after the three-minute treatment.

TABLE 2

Composition of Basic Aqueous Hydrogen Peroxide Solution and Treatment Temperature

| 28% by mass aqueous ammonia solution | 33% by mass aqueous hydrogen peroxide solution | Water | Temperature |
|---|---|---|---|
| 25 mL | 100 mL | 500 mL | 50° C. |

TABLE 3

| | Result of Resistance Test |
|---|---|
| Example 1 | ○ |
| Example 2 | ○ |
| Example 3 | ○ |
| Example 4 | ○ |
| Example 5 | ○ |
| Example 6 | ○ |
| Example 7 | ○ |
| Example 8 | ○ |
| Example 9 | ○ |
| Example 10 | ○ |
| Comparative Example 1 | x |
| Comparative Example 2 | x |
| Comparative Example 3 | x |
| Comparative Example 4 | x |
| Comparative Example 5 | x |
| Comparative Example 6 | x |
| Comparative Example 7 | x |
| Comparative Example 8 | x |

The results of Table 3 above indicated that the coating films made using the protective film-forming compositions prepared in Example 1 to Example 10 had sufficient resistance to the basic aqueous hydrogen peroxide solution. That is, these coating films have been found to be capable of serving as protective films against basic aqueous hydrogen peroxide solutions. By contrast, the coating films made using the film-forming compositions prepared in Comparative Example 1 to Comparative Example 8 have been found to lack resistance to basic aqueous hydrogen peroxide solutions, and these coating films have been demonstrated to be unable to serve as protective films against basic aqueous hydrogen peroxide solutions.

(Test of Resistance to Basic Aqueous Hydrogen Peroxide Solution)

The protective film-forming compositions prepared in Example 11 and Example 12 and the film-forming compositions prepared in Comparative Example 9 and Comparative Example 10 were each used to make a coating film on a silicon substrate having a titanium nitride film formed on the surface thereof. On this coating film, 1 mm×1 mm cross-cuts (100 cells) were formed with a cutter knife. This coating film was immersed in a basic aqueous hydrogen peroxide solution having the composition shown in Table 2 above at the temperature indicated in this table. After that, the coating film was washed with water and dried. The peeling of the dried coating film was visually examined. The results are shown in Table 4 below. The time indicated in Table 4 was the immersion time taken for the coating film to be peeled. It should be noted that the coating film made using the protective film-forming composition prepared in Example 11 was not peeled even after the immersion time reached beyond 15 minutes.

TABLE 4

|  | Result of Resistance Test |
| --- | --- |
| Example 11 | More than 15 minutes |
| Example 12 | 10 minutes and 30 seconds |
| Comparative Example 9 | 5 minutes and 30 seconds |
| Comparative Example 10 | 1 minutes and 30 seconds |

The results of Table 4 above indicated that the coating films made using the protective film-forming compositions prepared in Example 11 and Example 12 had sufficient resistance to the basic aqueous hydrogen peroxide solution. That is, these coating films have been found to be capable of serving as protective films against basic aqueous hydrogen peroxide solutions. The coating films made using the film-forming compositions prepared in Comparative Example 9 and Comparative Example 10 have been found to have lower resistance to basic aqueous hydrogen peroxide solutions than the coating films made using the protective film-forming compositions prepared in Example 11 and Example 12. That is, the coating films made using the film-forming compositions prepared in Comparative Example 9 and Comparative Example 10 have been demonstrated to have insufficient resistance for treatment with a basic aqueous hydrogen peroxide solution under harsher conditions.

The invention claimed is:

1. A composition for forming protective films against aqueous hydrogen peroxide solutions, the composition comprising:

a compound of the following formula (1a), a compound of the following formula (1b), or a compound of the following formula (2a-1) or a compound having a substituent of the following formula (2) and having a molecular weight of 300 or more and less than 800 or a weight-average molecular weight of 300 or more and less than 800:

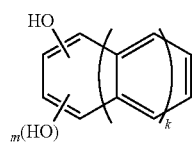
(1a)

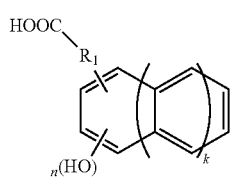
(1b)

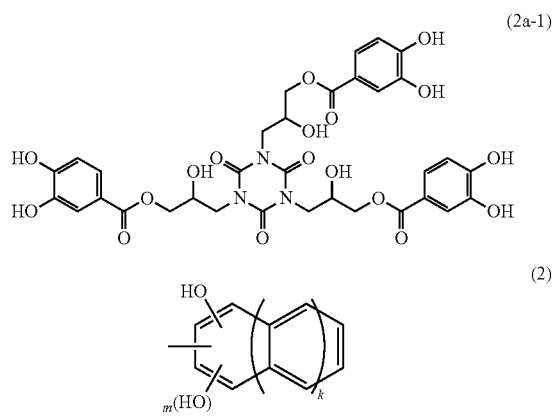
(2a-1)

(2)

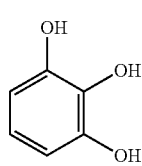

in which $R_1$ is a $C_{1-4}$ alkylene or alkenylene group or a direct bond, k is 0 or 1, m is an integer of 1 to 3, and n is an integer of 2 to 4; and a solvent; wherein the composition contains 0.1% by mass to 60% by mass of the compound of the formula (1a) or 0.1% by mass to 60% by mass of the compound of the formula (1b), relative to solids excluding the solvent, or the composition contains 10% by mass to 100% by mass of the compound of the formula (2a-1) or 10% by mass to 100% by mass of the compound of the compound having the substituent of the formula (2), relative to solids excluding the solvent;

the compound of the formula (1a) is a compound selected from the group consisting of formula (1a-2), formula (1a-3), formula (1a-4), formula (1a-5), formula (1a-6), formula (1a-7), formula (1a-8), formula (1a-9), formula (1a-11), formula (1a-12), formula (1a-13), formula (1a-14), formula (1a-15), formula (1a-16) and formula (1a-18):

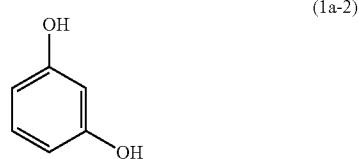
(1a-2)

(1a-3)

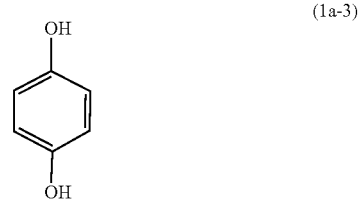
(1a-4)

the compound of the formula (1b) is a compound selected from the group consisting of formula (1b-1), formula (1b-2), formula (1b-3), formula (1b-4), formula (1b-6), formula (1b-7), formula (1b-8), formula (1b-9), formula (1b-10), formula (1b-11), formula (1b-12), formula (1b-13), formula (1b-14), formula (1b-15), formula (1b-16), formula (1b-17), formula (1b-18), formula (1b-19), formula (1b-20), formula (1b-21), formula (1b-22), formula (1b-23), formula (1b-24), formula (1b-25), formula (1b-26), formula (1b-27), formula (1b-28), formula (1b-29), and formula (1b-30):

(1b-6) 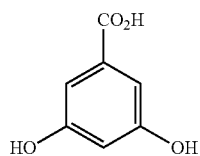
(1b-7) 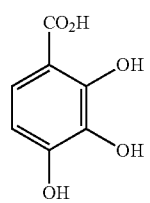
(1b-8) 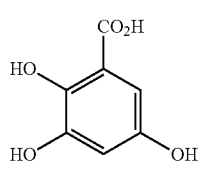
(1b-9) 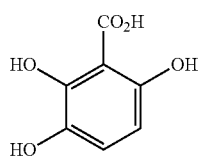
(1b-10) 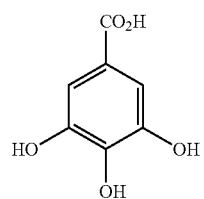
(1b-11) 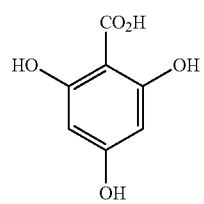
(1b-12) 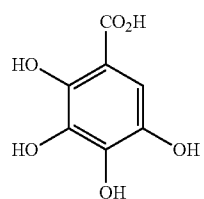
(1b-13) 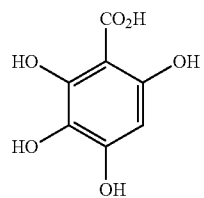
(1b-14) 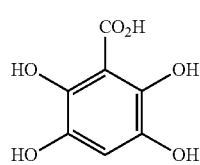
(1b-15) 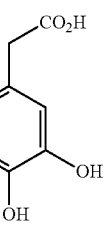
(1b-16) 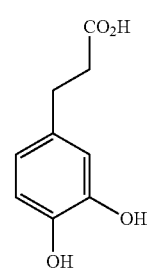
(1b-17) 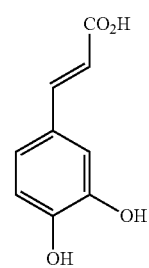
(1b-18) 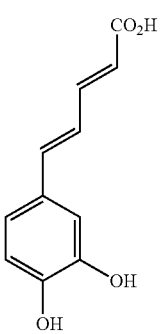
(1b-19) 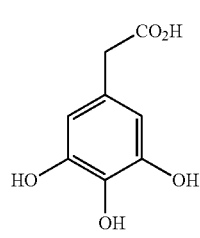

-continued (1b-20)

(1b-21)

(1b-22)

(1b-23)

(1b-24)

(1b-25)

(1b-26)

-continued (1b-27)

(1b-28)

(1b-29)

(1b-30)
; and the substituent of the formula (2) is a substituent selected from the group consisting of formula (2-3), formula (2-5), formula (2-6), formula (2-7), formula (2-8), formula (2-9), formula (2-10), formula (2-11), formula (2-12), formula (2-13) and formula (2-14):

(2-3)

(2-5)

(2-6)

-continued

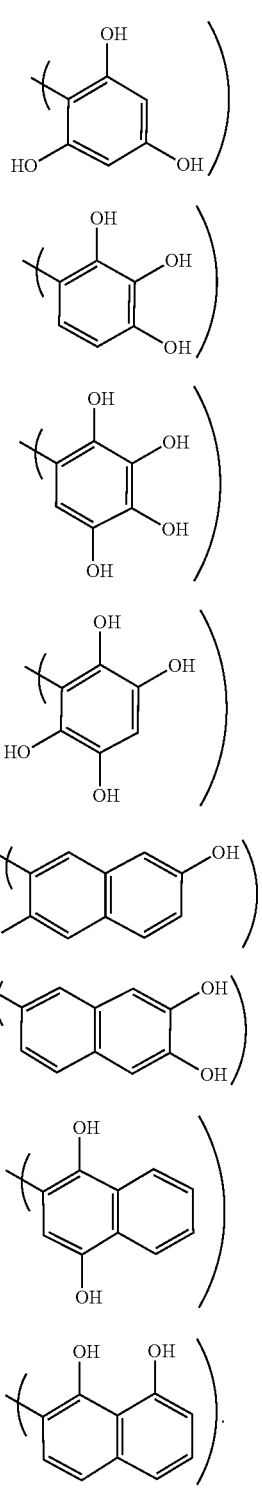

2. The composition for forming protective films against aqueous hydrogen peroxide solutions according to claim 1, further comprising a compound having at least two of epoxy group, oxetanyl group, epoxycyclohexyl group, or epoxycyclopentyl group per molecule.

3. The composition for forming protective films against aqueous hydrogen peroxide solutions according to claim 1, further comprising a compound having no phenolic hydroxy group, wherein the composition contains the compound of the formula (1a) or formula (1b) of 0.1% by mass to 60% by mass relative to the compound having no phenolic hydroxy group.

4. The composition for forming protective films against aqueous hydrogen peroxide solutions according to claim 3, wherein the compound having no phenolic hydroxy group is a polymer.

5. A pattern formation method comprising:
a first step of forming a protective film on a semiconductor substrate by using the composition for forming protective films against aqueous hydrogen peroxide solutions according to claim 1, wherein the semiconductor substrate optionally has an inorganic film formed on a surface of the semiconductor substrate;
a second step of forming a resist pattern on the protective film;
a third step of uncovering a surface of the inorganic film or the semiconductor substrate by dry-etching the protective film with the resist pattern serving as a mask; and
a fourth step of wet-etching and cleaning the inorganic film or the semiconductor substrate by using an aqueous hydrogen peroxide solution with the dry-etched protective film serving as a mask.

6. The composition for forming protective films against aqueous hydrogen peroxide solutions according to claim 1, wherein the composition contains the compound of the formula (1a).

7. The composition for forming protective films against aqueous hydrogen peroxide solutions according to claim 1, wherein the composition contains the compound of the formula (1b).

8. The composition for forming protective films against aqueous hydrogen peroxide solutions according to claim 1, wherein the composition contains the compound of the formula (2a-1).

9. The composition for forming protective films against aqueous hydrogen peroxide solutions according to claim 1, wherein the composition contains the compound having the substituent of the formula (2), the compound having the substituent of the formula (2) having a molecular weight of 300 or more and less than 800.

10. The composition for forming protective films against aqueous hydrogen peroxide solutions according to claim 1, wherein the composition contains the compound having the substituent of the formula (2), the compound having the substituent of the formula (2) having a weight-average molecular weight of 300 or more and less than 800.

* * * * *